(12) United States Patent
Sugitani

(10) Patent No.: US 12,537,485 B2
(45) Date of Patent: Jan. 27, 2026

(54) POWER AMPLIFIER

(71) Applicant: Mitsubishi Electric Corporation, Tokyo (JP)

(72) Inventor: Takumi Sugitani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 491 days.

(21) Appl. No.: 18/247,867

(22) PCT Filed: Feb. 24, 2021

(86) PCT No.: PCT/JP2021/006738
§ 371 (c)(1),
(2) Date: Apr. 4, 2023

(87) PCT Pub. No.: WO2022/180658
PCT Pub. Date: Sep. 1, 2022

(65) Prior Publication Data
US 2024/0014784 A1     Jan. 11, 2024

(51) Int. Cl.
*H03F 3/68* (2006.01)
*H03F 1/42* (2006.01)
(Continued)

(52) U.S. Cl.
CPC .............. *H03F 1/42* (2013.01); *H03F 3/245* (2013.01); *H03F 3/211* (2013.01); *H03F 3/602* (2013.01);
(Continued)

(58) Field of Classification Search
CPC ........ H03F 1/42; H03F 3/245; H03F 2200/36; H03F 3/211; H03F 3/604; H03F 3/19;
(Continued)

(56) References Cited

U.S. PATENT DOCUMENTS

| | | | | |
|---|---|---|---|---|
| 5,111,157 A | * | 5/1992 | Komiak | H03F 3/604 330/307 |
| 7,158,386 B2 | * | 1/2007 | Shih | H03F 3/602 330/295 |

(Continued)

FOREIGN PATENT DOCUMENTS

| JP | S62-109410 A | 5/1987 |
|---|---|---|
| JP | H02-111905 U | 9/1990 |
| JP | H11-150431 A | 6/1999 |

OTHER PUBLICATIONS

International Search Report issued in PCT/JP2021/006738; mailed May 18, 2021.

*Primary Examiner* — Khanh V Nguyen
(74) *Attorney, Agent, or Firm* — Studebaker Brackett PLLC

(57) ABSTRACT

A power amplifier includes: a plurality of amplifiers; a tournament circuit including a plurality of transmission lines arranged in a tournament form and connected to the plurality of amplifiers; and a plurality of difference frequency short circuits each including an inductor and a capacitor connected in series to each other, wherein resonant frequencies of the plurality of difference frequency short circuits become smaller as the difference frequency short circuits are farther from the plurality of amplifiers, and difference frequency short circuits connected to a plurality of nodes in a stage closest to the amplifiers of the tournament circuit among the plurality of difference frequency short circuits include inductive reactance that resonates with impedance seen from the nodes toward the amplifiers at an operating frequency and have different resonant frequencies.

9 Claims, 8 Drawing Sheets

(51) Int. Cl.
 *H03F 3/21* (2006.01)
 *H03F 3/24* (2006.01)
 *H03F 3/60* (2006.01)

(52) U.S. Cl.
 CPC .... *H03F 2200/36* (2013.01); *H03F 2200/451* (2013.01)

(58) Field of Classification Search
 CPC ........... H03F 3/68; H03F 3/602; H03F 3/195; H03F 1/302; H03F 2200/18; H03F 1/301; H03F 1/0288
 See application file for complete search history.

(56) References Cited

U.S. PATENT DOCUMENTS

| | | | |
|---|---|---|---|
| 9,647,615 B2 * | 5/2017 | Kuwata | ..................... H03F 1/42 |
| 12,040,756 B2 * | 7/2024 | Yoshioka | ................ H03F 3/604 |

* cited by examiner

POWER AMPLIFIER

FIELD

The present disclosure relates to a power amplifier that amplifies power at a high frequency and particularly excels in linearity in a wide band.

BACKGROUND

Microwave power amplifiers to be mounted on satellites and for base station in a mobile communication system are required to be made smaller in size and have high-power and wide-band characteristics. With increase of an amount of information to be transmitted, microwave power amplifiers which have favorable distortion characteristics and which excel in linearity even in a case where a band width of a high frequency signal that carries information is expanded, are desired. In such a microwave power amplifier, higher output is achieved by increasing a gate width of a transistor to be used in the microwave power amplifier by arranging amplifiers in parallel or synthesizing a plurality of amplifiers in parallel. In the power amplifier, in terms of heat dissipation and versatility, internal matching is typically performed in which a plurality of amplifiers that operate in parallel are made to match with each other inside a package.

In a case where a microwave signal including a number of carrier frequencies is input to the power amplifier, typically, a phenomenon occurs that a second-order distortion component in a difference frequency of the carrier frequencies degrades intermodulation distortion. This distortion component has a frequency of an absolute value |f1−f2| of a difference between carrier frequencies f1 and f2. This frequency interval is referred to as an offset width or an offset frequency, and a frequency corresponding to the width is referred to as a frequency of a difference frequency or simply referred to as a difference frequency.

For example, PTL 1 discloses a microwave power amplifier capable of preventing degradation of distortion characteristics at the microwave power amplifier by one end of a $\lambda/4$ line whose other end is connected to a drain terminal of a transistor or an output terminal of the amplifier, being connected to a plurality of capacitors that serially resonate with inductance of the line at a difference frequency.

CITATION LIST

Patent Literature

[PTL 1] JP H11-150431 A

SUMMARY

Technical Problem

While both increase of an offset width and lower distortion are required to achieve higher capacity of transmission information, it was extremely difficult with a bias circuit disclosed in PTL 1 to achieve lower distortion while increasing an offset frequency in the order of 100 MHz.

This is because in the bias circuit disclosed in PTL 1, a plurality of capacitors 8 provided in parallel are connected to a single $\lambda/4$ wavelength line 7, and thus, the bias circuit disclosed in PTL 1 has a single resonant frequency. Thus, in the bias circuit disclosed in PTL 1, it is impossible to obtain distortion characteristics by setting impedance of the difference frequency at a sufficient low value over a wide band in the order of 1 MHz to 100 MHz.

For example, it is also possible to directly connect a plurality of difference frequency short circuits having different resonant frequencies to the drain terminal. However, in this case, due to limitations of a mounting area within the package, there is a problem that all inductors and capacitors that constitute the difference frequency short circuits cannot be positioned unless a package size is made larger.

Further, typically, output impedance of a high-power amplifier to be mounted and used on a satellite in a mobile communication system is lower than 50Ω and is in a capacitive region in view of parasitic capacitance. Thus, in a case where an inductor that forms a short stub has an electrical length of $\lambda/4$ with respect to an operating frequency, the output impedance cannot be altered on real axes. It was therefore difficult to implement an output matching circuit that achieves favorable impedance matching with respect to an operating frequency over a wide band.

The present disclosure has been made to solve the problem as described above and is directed to providing a power amplifier that excels in linearity in a wide band without increasing a packet size in a power amplifier that amplifies a microwave, for example, equal to or higher than several GHz.

Solution to Problem

A power amplifier according to the present disclosure includes: a plurality of amplifiers; a tournament circuit including a plurality of transmission lines arranged in a tournament form and connected to the plurality of amplifiers; and a plurality of difference frequency short circuits each including an inductor and a capacitor connected in series to each other, wherein resonant frequencies of the plurality of difference frequency short circuits become smaller as the difference frequency short circuits are farther from the plurality of amplifiers, and difference frequency short circuits connected to a plurality of nodes in a stage closest to the amplifiers of the tournament circuit among the plurality of difference frequency short circuits include inductive reactance that resonates with impedance seen from the nodes toward the amplifiers at an operating frequency and have different resonant frequencies.

Advantageous Effects of Invention

According to the present disclosure, it is possible to provide a power amplifier that excels in linearity in a wide band without increasing a packet size in a power amplifier that amplifies a microwave.

DESCRIPTION OF EMBODIMENTS

First Embodiment

Figure 1:
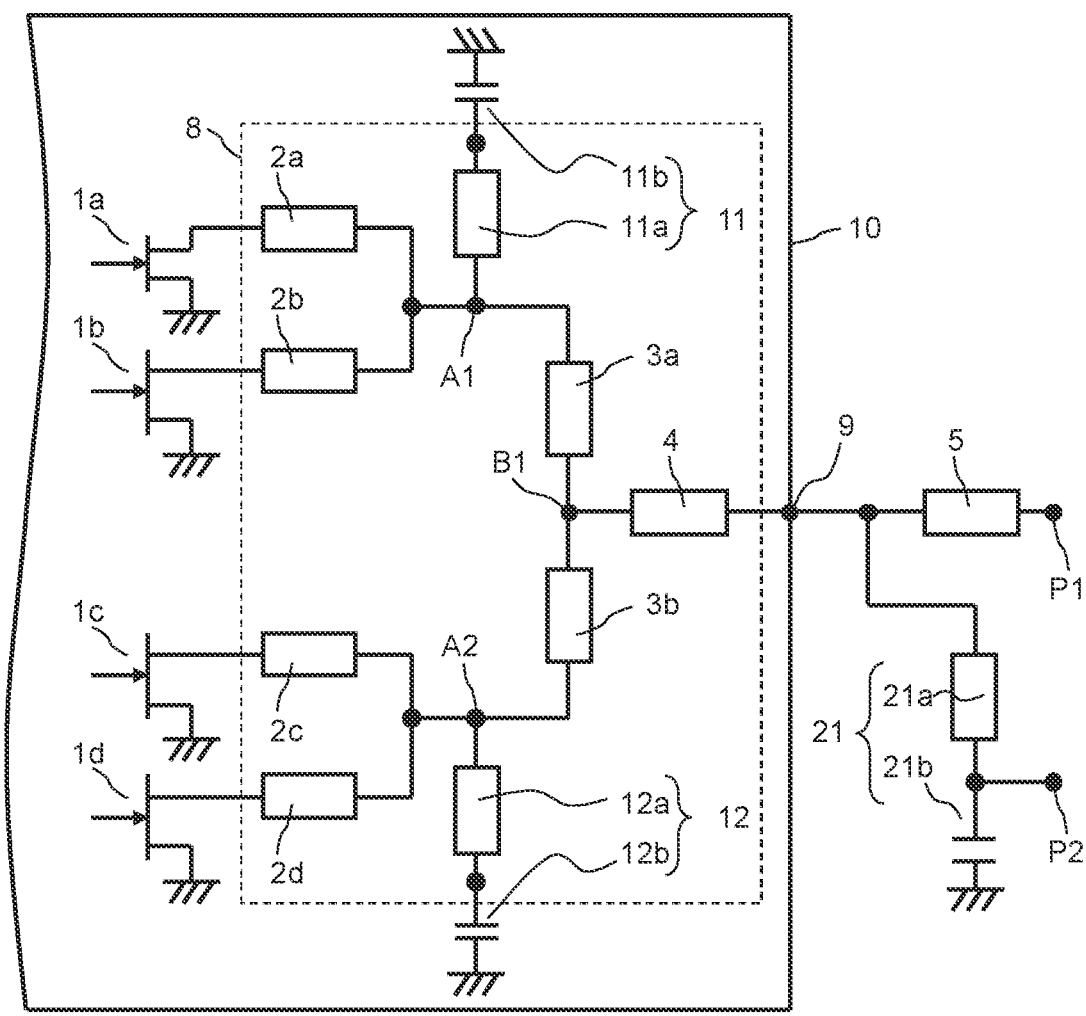
FIG. 1 is a circuit diagram of a power amplifier according to a first embodiment.

A power amplifier according to embodiments of the present disclosure will be described with reference to the drawings. The same reference numerals will be assigned to the same or corresponding components, and redundant description will be omitted.

FIG. 1 is a circuit diagram of a power amplifier 100 according to a first embodiment of the present disclosure. The power amplifier 100 operates as a microwave power amplifier on which microwave power is incident and which amplifies the microwave power. In the first embodiment, an operating frequency at which the power amplifier 100 operates is 14 GHz band, but the operating frequency is not limited to this.

While different reference numerals are assigned to amplifiers 1a to 1d to distinguish from each other, the amplifiers 1a to 1d are amplifiers 1 having the same characteristics. As the amplifier 1, a high electron mobility transistor (HEMT) formed on a gallium nitride substrate, a metal semiconductor field effect transistor (MESFET) formed on a gallium arsenide substrate, or the like, can be used. The amplifiers 1a to 1d may be formed on the same chip or may be formed on different chips. In a case where it is desired to implement a high-power amplifier 1, it is preferable to employ a multi-cell configuration in which cell regions are arranged in parallel.

Output impedance of the amplifiers 1a to 1d is lower than 50Ω and is in a capacitive region.

One end of a series inductor 2a is connected to an output side of the amplifier 1a. In a similar manner, one end of a series inductor 2b, one end of a series inductor 2c, and one end of a series inductor 2d are connected to an output side of the amplifier 1b, an output side of the amplifier 1c and an output side of the amplifier 1d respectively.

While different reference numerals are assigned to the series inductors 2a to 2d to distinguish from each other, the series inductors 2a to 2d are series inductors 2 having the same characteristics. In other words, the series inductors 2 are respectively connected to the output sides of the plurality of amplifiers 1. As the series inductor 2, a transmission line such as a microstrip line, a bonding wire, or the like, can be used.

A parallel inductor 11a and a capacitor 11b constitute a difference frequency short circuit 11. One end of the parallel inductor 11a is connected to a connection point (node) A1 of the series inductors 2a and 2b, the other end of the parallel inductor 11a is connected to one end of the capacitor 11b, and the other end of the capacitor 11b is grounded. In other words, the difference frequency short circuit 11 is shunt-connected to the connection point A1. An inductance value of the parallel inductor 11a is L1.

The parallel inductor 11a is set at inductance that resonates at the operating frequency for a capacitive component of impedance seen from the connection point A1 of the series inductors 2a and 2b toward the amplifier 1 side. The capacitor 11b has a capacitance value C1 that serially resonates with the parallel inductor 11a at a difference frequency Δf1.

The parallel inductor 12a and the capacitor 12b constitute a difference frequency short circuit 12. One end of the parallel inductor 12a is connected to a connection point (node) A2 of the series inductors 2c and 2d, the other end of the parallel inductor 12a is connected to one end of the capacitor 12b, and the other end of the capacitor 12b is grounded. In other words, the difference frequency short circuit 12 is shunt-connected to the connection point A2. An inductance value of the parallel inductor 12a is L1.

The parallel inductor 12a is set at inductance that resonates at the operating frequency for a capacitive component of impedance seen from the connection point A2 of the series inductors 2c and 2d toward the amplifier 1 side. The capacitor 12b has a capacitance value C2 that serially resonates with the parallel inductor 12a at a difference frequency Δf2.

The capacitor 11b is a capacitor for grounding the parallel inductor 11a at a high frequency (operating frequency), and the capacitor 12b is a capacitor for grounding the parallel inductor 12a at the operating frequency. The capacitors 11b and 12b may have a structure in which a dielectric layer having a high relative permittivity is put between upper and lower electrodes.

While the capacitance value C1 of the capacitor 11b is different from the capacitance value C2 of the capacitor 12b, both the capacitor 11b and the capacitor 12b have capacitance values large enough to be regarded as substantially short-circuit at the operating frequency. Thus, impedance of the difference frequency short circuit 11 seen from the connection point A1 and impedance of the difference frequency short circuit 12 seen from the connection point A2 can be regarded as substantially the same.

The series inductors 3a and 3b are series inductors 3 having the same characteristics although different reference numerals are assigned to distinguish from each other. One end of the series inductor 3a is connected to the connection point A1. One end of the series inductor 3b is connected to the connection point A2. The other end of the series inductor 3a and the other end of the series inductor 3a are connected at a connection point (node) B1.

A series inductor 4 which has one end connected to the connection point B1 and the other end connected to a package terminal 9 of a package 10, is connected to outside of the package 10 via the package terminal 9. The series inductor 4 is a transmission line which alters impedance seen from the connection point B1 toward the amplifier 1 side to 50Ω and which has an electrical length of approximately λ/4 at a center frequency of an operating frequency band. The series inductors 3 and 4 are transmission lines such as a microstrip line.

In this manner, the series inductors 2a, 2b, 2c, 2d, 3a, 3b and 4 are arranged in a tournament form. These transmission lines constitute a tournament circuit connected to the amplifiers 1a, 1b, 1c and 1d which are a plurality of amplifiers. The tournament circuit in the first embodiment is a tournament synthesis circuit that synthesizes amplified signals of the plurality of amplifiers. In the tournament synthesis circuit, first, power from two transistors is synthesized in a first stage, and then, the synthesized power is further synthesized in a second stage. Thus, signal synthesis is repeated.

The series inductor 4 positioned within the package 10 constitutes an output matching circuit along with the series inductor 2, the difference frequency short circuits 11 and 12 and the series inductor 3.

A series inductor 5 is connected to the package terminal 9 and a terminal P1 of the power amplifier 100. The terminal P1 functions as an output terminal of the power amplifier 100.

The difference frequency short circuit 21 includes a parallel inductor 21a having one end connected to the package terminal 9 and a capacitor 21b connected to the other end of the parallel inductor 21a. The other end of the capacitor 21b is grounded. The parallel inductor 21a is a transmission line having an electrical length of λ/4 in the operating frequency band and is constituted with a microstrip line. Inductance of the parallel inductor 21a is L2. The capacitor 21b has a capacitance value C3 and grounds the parallel inductor 21a in the operating frequency band. The capacitor 21b and the parallel inductor 21a serially resonate at a difference frequency Δf3.

The difference frequency short circuit 21 operates as a bias circuit, that is, the difference frequency short circuit 21 also serves as DC bias voltage supplying means. A voltage application terminal P2 exists between the parallel inductor 21a and the capacitor 21b, and a DC bias source that applies a drain voltage to the amplifier 1 is connected to the voltage application terminal P2. The DC bias source supplies a predetermined DC bias voltage to the DC bias voltage supplying means.

The parallel inductor 21a is a transmission line having a length of approximately λ/4 at a center frequency of the operating frequency band, and thus, impedance seen from the package terminal 9 toward the difference frequency short circuit 21 in the operating frequency band becomes high impedance in a similar manner to related art.

A substrate 8 is a microwave integrated circuit (MIC) and is indicated with a dotted line in FIG. 1. A pattern of a transmission line connected from the amplifier 1 to the package terminal 9 and parallel inductors located in the same region can be formed on the substrate 8 using metal wirings. Further, the substrate 8, the amplifier 1, and the capacitors 11b and 12b are mounted on the package 10 using a joint material such as soldering.

The power amplifier 100 includes three difference frequency short circuits 11, 12 and 21. There are the following relationships among the inductors, the capacitors and resonant frequencies to be used in these difference frequency short circuits.

$$L1 \times C1 = 1/(2\pi \Delta f1)^2$$

$$L1 \times C2 = 1/(2\pi \Delta f2)^2$$

$$L2 \times C3 = 1/(2\pi \Delta f3)^2$$

Here, Δf1 is a resonant frequency of the difference frequency short circuit 11, Δf2 is a resonant frequency of the difference frequency short circuit 12, and Δf3 is a resonant frequency of the difference frequency short circuit 21.

Δf1, Δf2 and Δf3 exist between a possible minimum value and a possible maximum value of difference frequencies (or difference frequencies) at a high frequency end and a low frequency end of a frequency (operating frequency) of a high-frequency signal amplified at the power amplifier 100. Note that setting of a band width is different depending on a communication system, and thus, the minimum value and the maximum value fluctuate depending on the communication system.

It is assumed that Δf1, Δf2 and Δf3 have a magnitude relationship of Δf1>Δf2>Δf3. It is assumed that the capacitance values C1, C2 and C3 have a magnitude relationship of C1<C2<C3.

In a case where the inductance value is L1, inductance that constitutes the difference frequency short circuit in the first embodiment is a transmission line having an electrical length less than λ/4 at the operating frequency, and in a case where the inductance value is L2, inductance is a transmission line having an electrical length of λ/4 at the operating frequency.

Figure 2:
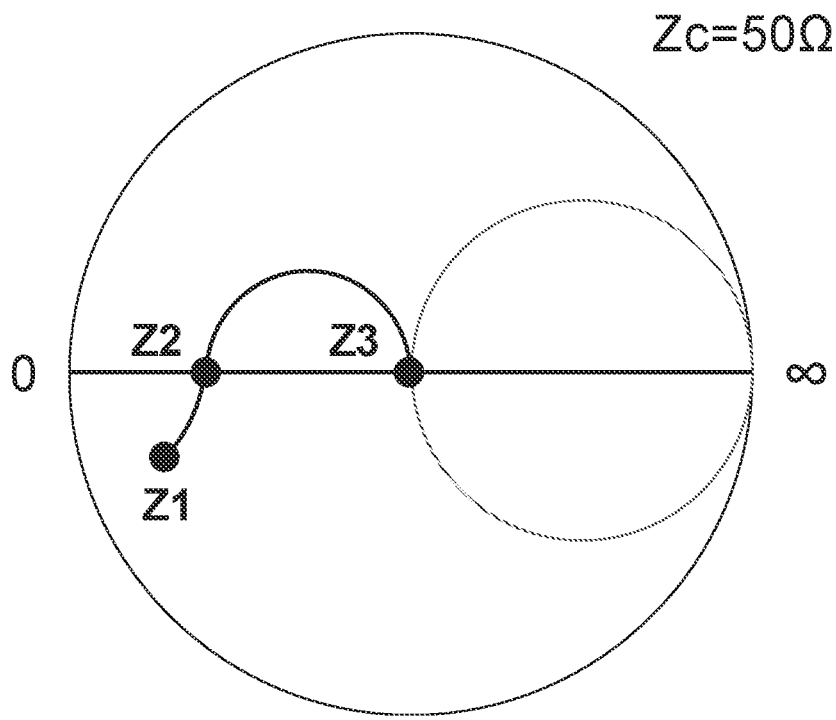
FIG. 2 is an explanatory diagram of an impedance trajectory of the power amplifier according to the first embodiment.

Operation of the power amplifier 100 will be described next. FIG. 2 is an explanatory diagram of an impedance trajectory of the power amplifier 100 according to the first embodiment. FIG. 2 is a Smith chart for explaining impedance conversion of a load on an output side of the power amplifier 100 and is normalized at 50Ω.

Z1 indicates impedance seen from the connection point A1 toward the amplifier 1 side in a state where the difference frequency short circuit 11 is not connected to the connection point A1 and impedance seen from the connection point A2 toward the amplifier 1 side in a state where the difference frequency short circuit 12 is not connected to the connection point A2. The impedance on the output side of the amplifier 1 has, for example, a low resistance component like 3Ω and output capacity that is parallel to the resistance component. While the impedance on the output side of the amplifier 1 is converted by the series inductor 2, its electrical length is set at a length at which the impedance seen from the connection point A1 toward the amplifier 1 side in a state where the difference frequency short circuit 11 is not connected and the impedance seen from the connection point A2 toward the amplifier 1 side in a state where the difference frequency short circuit 12 is not connected do not reach on real axes and remain capacitive.

Z2 indicates impedance seen from the connection point A1 toward the amplifier 1 side in a state where the difference frequency short circuit 11 is connected to the connection point A1 and impedance seen from the connection point A2 toward the amplifier 1 side in a state where the difference frequency short circuit 12 is connected to the connection point A2. In other words, Z2 is impedance in which Z1 and the difference frequency short circuit 11 are connected in parallel or impedance in which Z1 and the difference frequency short circuit 12 are connected in parallel.

The series inductor 2 and the parallel inductors 11a and 12a are set so that the difference frequency short circuits 11 and 12 contribute to impedance matching as part of the matching circuit.

Specifically, an electrical length of the parallel inductor 11a is set shorter than λ/4 at the operating frequency so that impedance seen from the connection point A1 toward the difference frequency short circuit 11 exhibits inductive reactance. The series inductors 2a and 2b are set so that the impedance seen from the connection point A1 toward the amplifiers 1a and 1b becomes capacitive reactance that resonates with the reactance at the operating frequency.

Further, an electrical length of the parallel inductor 12a is set shorter than λ/4 at the operating frequency so that impedance seen from the connection point A2 toward the difference frequency short circuit 12 exhibits inductive reactance. The series inductors 2c and 2d are set so that impedance seen from the connection point A2 toward the amplifiers 1c and 1d becomes capacitive reactance that resonates with the reactance at the operating frequency.

As a result of this, Z2 is located on the real axis. Note that while the electrical lengths of the parallel inductors 11a and 12a are set shorter than λ/4 at the operating frequency, this is shorter than that of the microwave amplifier in related art.

Z3 indicates impedance seen from the package terminal 9 toward the amplifier 1 side. This is Z2 after the impedance is altered by the series inductor 4.

At the power amplifier 100, characteristic impedance of the series inductor 4 is set at 25Ω, and an electrical length of the series inductor 4 is set at λ/4 at the center frequency. The series inductor 4 operates as a 90-degree inverter and makes output impedance of the power amplifier 100 match 50Ω at the package terminal 9.

Difference frequency impedance of the output circuit and IM3 in the first embodiment will be described next.

In the first embodiment, the difference frequency short circuit 21 with a resonant frequency small enough to allow a reflection phase to be ignored is positioned outside the package 10, and the difference frequency short circuits 11 and 12 with resonant frequencies at which a reflection phase cannot be ignored are positioned inside the package 10. For example, the resonant frequency at which the reflection phase can be ignored is a frequency in the order of 1 MHz, and, for example, the resonant frequency at which the reflection phase cannot be ignored is a frequency in the order of 10 to 100 MHz.

According to one example, a difference frequency short circuit with a resonant frequency equal to or larger than a specific resonant frequency determined in advance can be mounted on the package 10, and a difference frequency short circuit with a resonant frequency smaller than the specific resonant frequency can be provided outside the package 10. Such a specific resonant frequency is, for example, 10 MHz.

The difference frequency short circuits are positioned so that the resonant frequencies become smaller as the difference frequency short circuits are farther from the amplifiers 1a, 1b, 1c and 1d. In the example in FIG. 1, the difference frequency short circuits 11 and 12 with the largest resonant frequency among the plurality of difference frequency short circuits are positioned at a location closest from the amplifiers 1a, 1b, 1c and 1d, and the difference frequency short circuit 21 with the second largest resonant frequency is positioned at a location farther from the amplifiers 1a, 1b, 1c and 1d than the difference frequency short circuits 11 and 12.

Further, difference frequency short circuits to be positioned at a location closest to the amplifiers 1a, 1b, 1c and 1d are positioned after a connection point of two transmission lines connected to two amplifiers so that impedance of output circuits viewed from all the amplifiers 1a, 1b, 1c and 1d becomes uniform. Note that a case where impedance is uniform includes a case where the impedance is substantially equal as well as a case where impedance is completely identical.

While the capacitance value C1 of the capacitor 11b is different from the capacitance value C2 of the capacitor 12b, both the capacitors 11b and 12b have capacitance values large enough to be regarded as substantially short-circuit at the operating frequency. Thus, impedance of the difference frequency short circuit 11 seen from the connection point A1 and impedance of the difference frequency short circuit 12 seen from the connection point A2 can be regarded as substantially the same at the operating frequency.

In other words, the power amplifier 100 according to the first embodiment includes a tournament synthesis circuit that synthesizes amplified signals of a plurality of amplifiers. Nodes in a stage closest to the amplifiers of the tournament synthesis circuit are the connection point A1 and the connection point A2.

The difference frequency short circuit 11 to be connected to the connection point A1 and the difference frequency short circuit 12 to be connected to the connection point A2 have impedance that can be regarded as substantially the same at the operating frequency. Thus, impedance of output circuits viewed from all the amplifiers become uniform at the operating frequency, so that an effect of making the amplifiers uniform can be provided.

Further, the difference frequency short circuits 11 and 12 have different resonant frequencies. Thus, as will be described below, low impedance of a matching circuit seen from the output side of the amplifier 1 can be achieved in a range of a frequency of a wide difference frequency without increasing a package size.

The parallel inductor 11a that constitutes the difference frequency short circuit 11 and the parallel inductor 12a that constitutes the difference frequency short circuit 12 are transmission lines having an electrical length set at less than λ/4 at the operating frequency so that the difference frequency short circuits 11 and 12 contribute to impedance matching of the power amplifier 100.

In other words, a circuit that contributes to impedance matching can be positioned close to the amplifier, so that an effect of making an operating frequency band wider is provided. The difference frequency short circuits 11 and 12 play both a role of making an operating frequency band wider and a role of making impedance lower at the difference frequency of the tournament synthesis circuit, so that it is possible to prevent increase in the package size.

Figure 3:
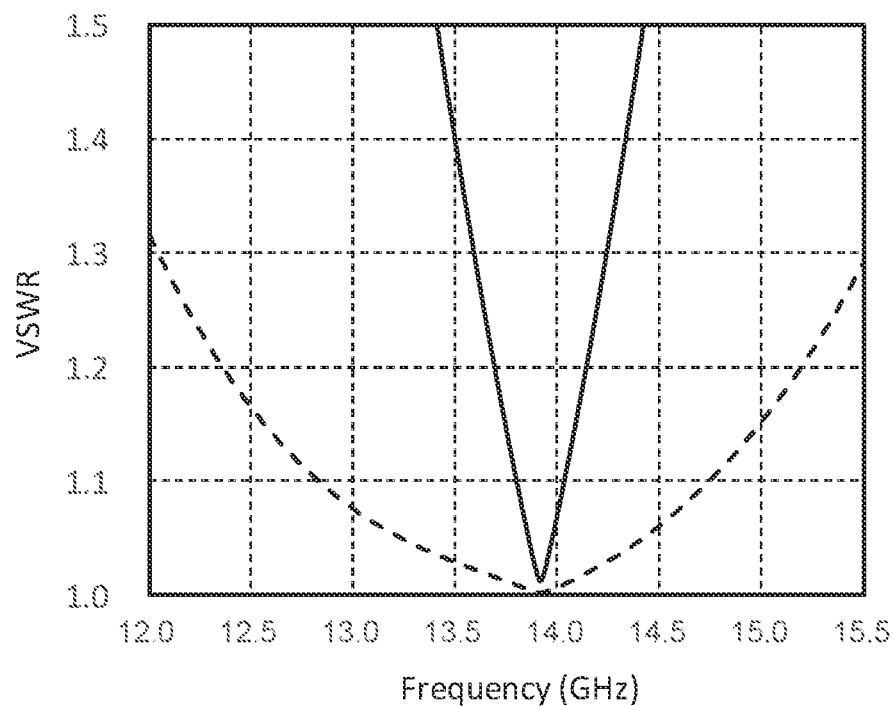
FIG. 3 is a view illustrating a VSWR on an output side of the power amplifier according to the first embodiment.

FIG. 3 is a view illustrating a VSWR on an output side of the power amplifier according to the first embodiment. FIG. 3 indicates a frequency on a horizontal axis and a voltage standing wave ratio (VSWR) on a vertical axis. FIG. 3 indicates a VSWR with respect to the package terminal 9 of the power amplifier 100 according to the first embodiment with a solid line. Along with this, FIG. 3 indicates a VSWR in a circuit configuration in related art, in which electrical lengths of the parallel inductor 11a of the difference frequency short circuit 11 and the parallel inductor 12a of the difference frequency short circuit 12 are λ/4, with a dashed line as a comparative example.

Note that in FIG. 3, the power amplifier 100 according to the first embodiment and the comparative example are designed so that the center frequency is set at 13.75 GHz, and respective circuits are optimized.

In FIG. 3, attention is focused on a range of 12 GHz to 15.5 GHz. This is a range in which a fractional bandwidth becomes 25% with respect to the center frequency of 13.75 GHz. In the circuit configuration in related art, as illustrated in FIG. 3, a maximum value of the VSWR is equal to or larger than 1.5, and large mismatch occurs. On the other hand, in the matching circuit in the power amplifier 100 according to the first embodiment, a maximum value of the VSWR is 1.3. In other words, favorable impedance matching can be achieved over a wide band compared to the comparative example.

Figure 4:
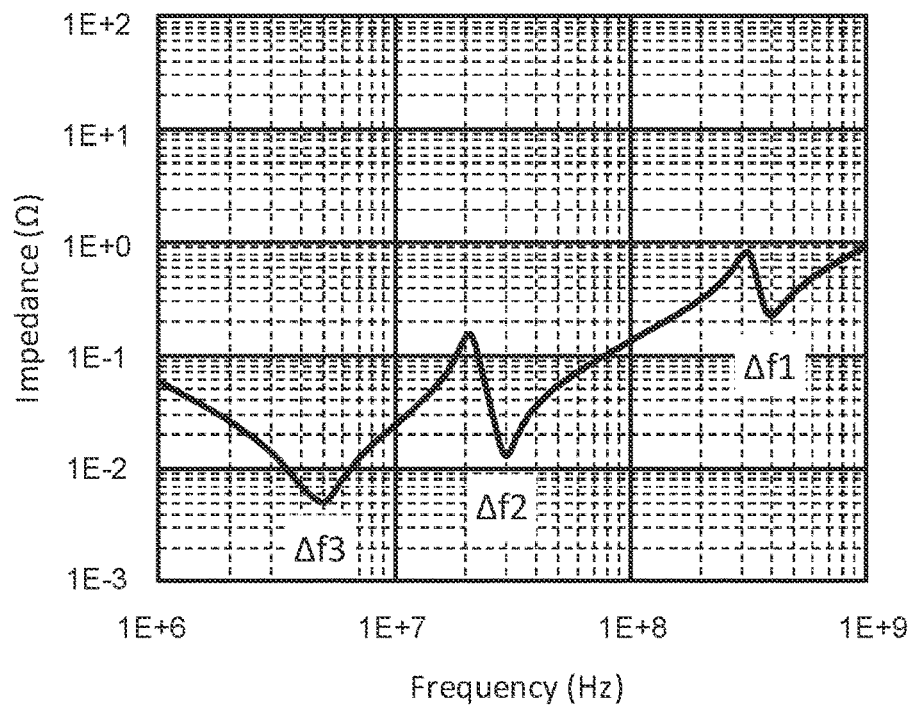
FIG. 4 is a view illustrating difference frequency impedance of the output circuit of the power amplifier according to the first embodiment.

Impedance at a difference frequency of the power amplifier 100 will be considered next. FIG. 4 is a view illustrating difference frequency impedance of the output circuit of the power amplifier according to the first embodiment. FIG. 4 indicates impedance seen from the output side of the amplifier 1 toward the package terminal 9 side with a log on a vertical axis and indicates a frequency from 1 MHz to 1 GHz with a log on a horizontal axis.

In the first embodiment, by appropriately setting capacitance of the difference frequency short circuits 11, 12 and 21, resonance points are created at 5 MHz, 30 MHz and 400

MHz, and impedance in the vicinity of the three resonance points is reduced to equal to or less than 1Ω.

Specifically, the difference frequency short circuit 11 creates the resonance point at 400 MHz (Δf1), the difference frequency short circuit 12 creates the resonance point at 30 MHz (Δf2), and the difference frequency short circuit 21 creates the resonance point at 5 MHz (Δf3). As a result of this, low impedance of equal to or less than 1Ω can be achieved in a wide frequency range of equal to or less than 1 GHz including the vicinity of the three resonance points.

Figure 5:
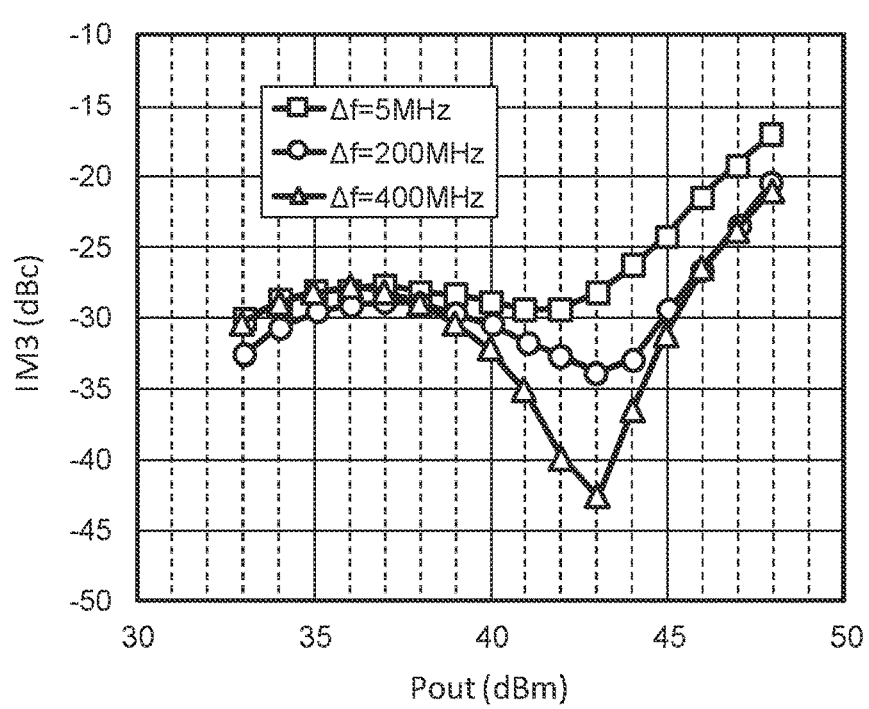
FIG. 5 indicates evaluation results of distortion characteristics of the power amplifier according to the first embodiment.

FIG. 5 indicates evaluation results of distortion characteristics of the power amplifier 100 according to the first embodiment. FIG. 5 indicates results of evaluating third-order modulation distortion (IM3) in a case where two signals having frequencies of f1 and f2 and having equal power value are input to the power amplifier 100 according to the first embodiment. Here, the IM3 is a power ratio of a frequency (2×f1−f2) and f1 or f2. FIG. 5 indicates output power of the power amplifier 100 on a horizontal axis and indicates third-order modulation distortion (IM3) on a vertical axis.

In FIG. 5, rectangles (□) indicate IM3 in a case where f1 is 13.75 GHz, f2 is 13.755 GHz, and two waves are separate by 5 MHz. Circles (○) indicate IM3 in a case where f1 is 13.75 GHz, f2 is 13.95 GHz, and two waves are separate by 200 MHz. Triangles (Δ) indicate IM3 in a case where f1 is 13.75 GHz, f2 is 14.15 GHz, and two waves are separate by 400 MHz.

In this manner, in the power amplifier 100 according to the present embodiment, by appropriately setting capacitance of the difference frequency short circuits 11, 12 and 21, even in a case where an interval of the carrier frequencies becomes large, it is possible to prevent degradation of intermodulation distortion. As a result of this, the IM3 is suppressed to equal to or less than −25 dBc in a range where the output power is equal to or less than 44 dBm and the offset frequency is equal to or less than 400 MHz.

Figure 6:
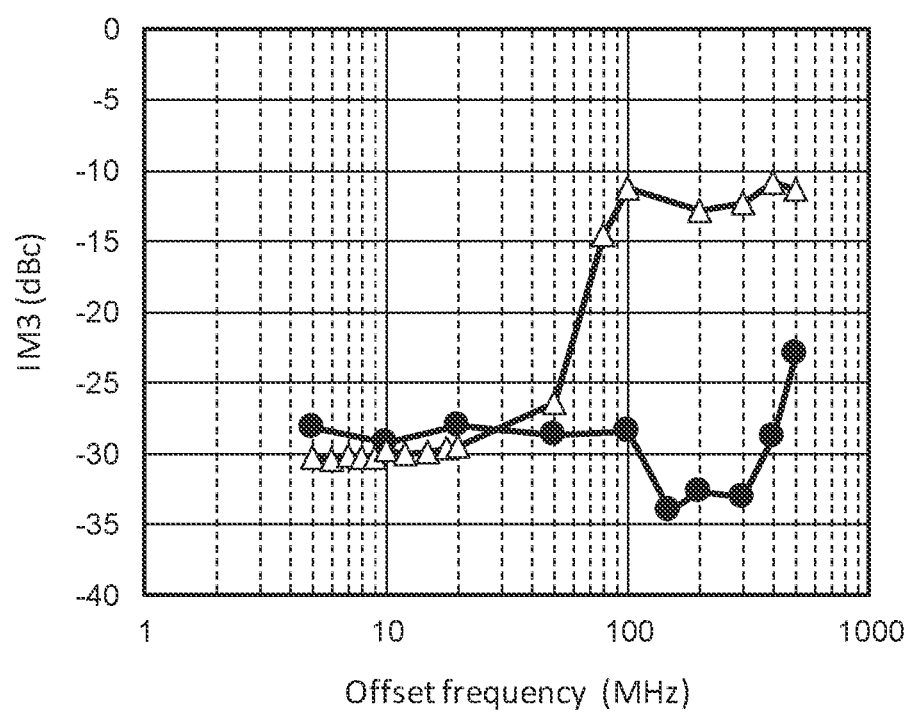
FIG. 6 indicates evaluation results of distortion characteristics of the power amplifier according to the first embodiment.

FIG. 6 indicates evaluation results of distortion characteristics of the power amplifier 100 according to the first embodiment. FIG. 6 indicates an offset frequency on a horizontal axis. FIG. 6 indicates third-order modulation distortion (IM3) in a case where output power of the power amplifier 100 and the comparative example is 42 dBm on a vertical axis. FIG. 6 indicates evaluation results of the power amplifier 100 with black circles (●) and indicates evaluation results of the power amplifier according to the comparative example with white circles (○).

To the power amplifier 100 and the power amplifier according to the comparative example, two waves of f1 that is 13.75 GHz and fixed, and f2 that is made higher than f1 by an offset frequency, are input. The capacitance values of the capacitors 11b and 12b of the difference frequency short circuit are made the same between the power amplifier 100 and the power amplifier according to the comparative example, and other circuit devices are adjusted so as to be optimum.

Referring to FIG. 6, the offset frequency at which the IM3 becomes equal to or less than −25 dBc is expanded to 400 MHz in the power amplifier 100 while the offset frequency is 50 MHz in the comparative example.

As described above, according to the first embodiment, a capacitive component of the impedance seen from the connection points A1 and A2 between the series inductors 2 connected in series to the amplifier 1 is made resonant with inductance components of the difference frequency short circuit 11 connected in parallel to the connection point A1 and the difference frequency short circuit 12 connected in parallel to the connection point A2.

Consequently, impedance of the output circuit viewed from the amplifier 1 can be reduced over a range from Δf1 to Δf3 as well as favorable impedance matching can be achieved in a wide band, so that distortion components generated at the offset frequency can be continuously reduced in a frequency band from Δf1 to Δf3.

This results in making it possible to reduce circuit size and prevent degradation of distortion characteristics over a range from a minimum offset frequency to a maximum offset frequency in a case where a desired offset frequency is expanded.

Note that while in the first embodiment, impedance is altered by the series inductor 4 so that the output impedance of the power amplifier 100 becomes 50Ω at the package terminal 9, impedance may be altered to 50Ω by so-called two-stage impedance alternation by serially connecting a transmission line having different characteristic impedance to the series inductor 4.

Various modifications can be made to the power amplifier according to the first embodiment within a range not losing characteristics of the power amplifier. For example, while in the first embodiment, two difference frequency short circuits are positioned in the package 10, the number of difference frequency short circuits can be increased while limitations of an area for mounting parts within the package 10 are taken into account.

Figure 7:
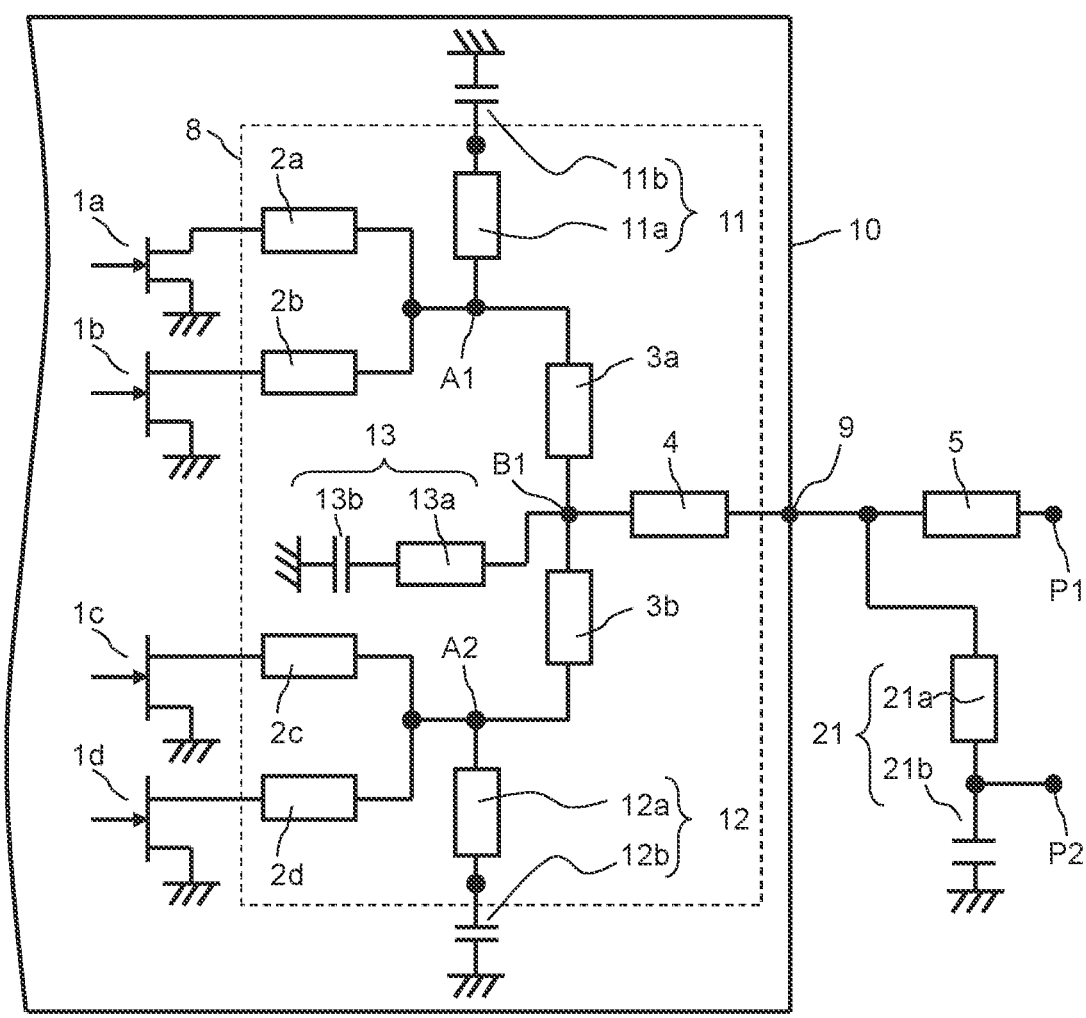
FIG. 7 is a circuit diagram of a power amplifier according to a modification of the first embodiment.

FIG. 7 is a circuit diagram of a power amplifier 110 according to a modification. The power amplifier 110 includes a supplemental difference frequency short circuit 13. Other configurations are the same as the configurations of the power amplifier 100. The supplemental difference frequency short circuit 13 is a series LC circuit including a parallel inductor 13a and a capacitor 13b and shunt-connected to a connection point B1 that is a node of the series inductor 4. The parallel inductor 13a has an electrical length of λ/4 at the operating frequency.

Here, a resonant frequency Δf4 of the supplemental difference frequency short circuit 13 has a relationship of Δf1>Δf2>Δf4>Δf3. The difference frequency short circuits 11 and 12 with large resonant frequencies are connected to the connection point A1 or A2 in a stage closest to the amplifiers 1a, 1b, 1c and 1d, the supplemental difference frequency short circuit 13 with the second largest resonant frequency is connected to the connection point B1 in a stage next closest to the amplifiers, and the difference frequency short circuit 21 with the largest resonant frequency is connected to a location farthest from the amplifiers.

The power amplifier 110 can achieve further flatter and lower impedance of a matching circuit seen from the output side of the amplifier 1 compared to the power amplifier 100, so that it becomes easy to achieve further lower distortion.

Figure 8:
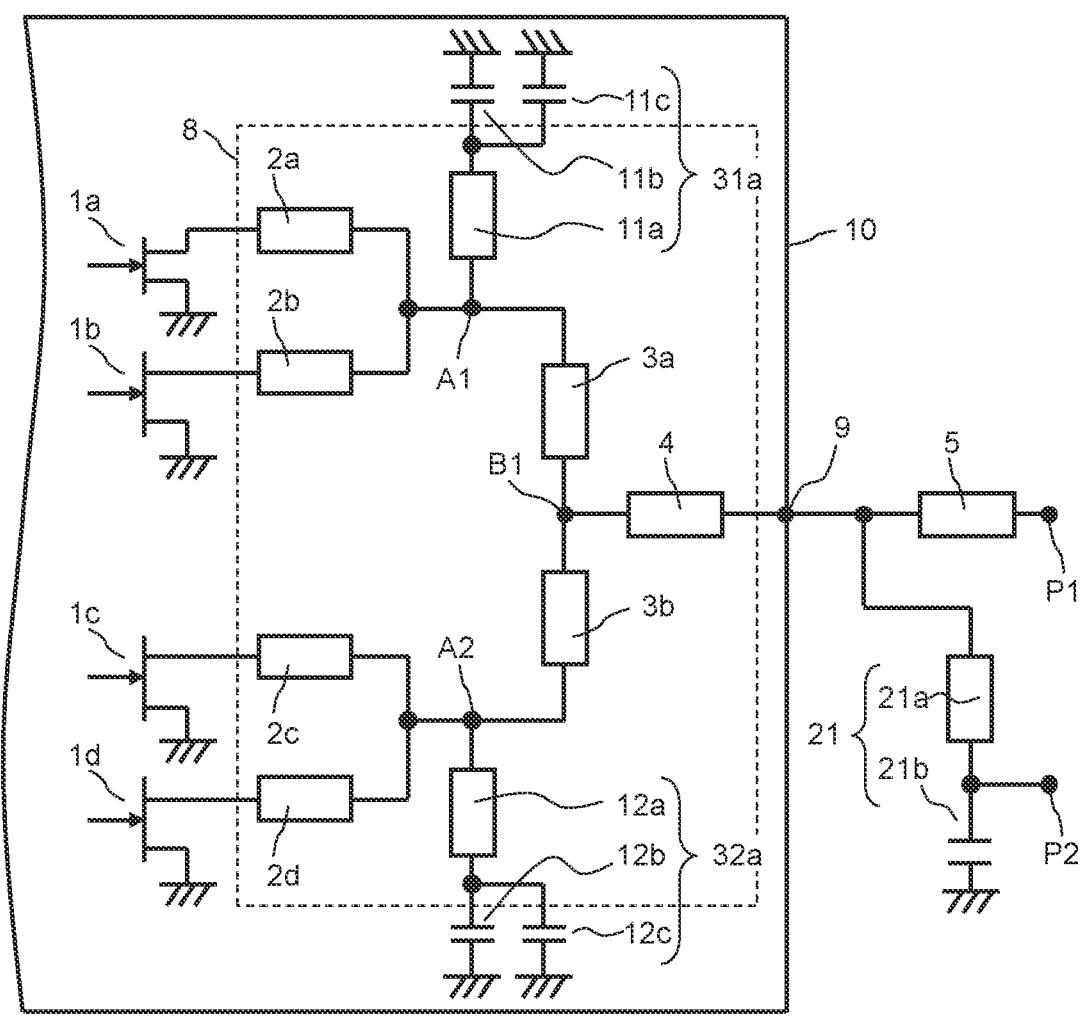
FIG. 8 is a circuit diagram of a power amplifier according to another modification of the first embodiment.

FIG. 8 is a circuit diagram of a power amplifier 120 according to another modification. The power amplifier 120 includes a difference frequency short circuit 31a in place of the difference frequency short circuit 11 and includes a difference frequency short circuit 32a in place of the difference frequency short circuit 12. Other configurations are the same as the configurations of the power amplifier 100.

The difference frequency short circuit 31a is different from the difference frequency short circuit 11 in that a supplemental capacitor 11c is provided in parallel to the capacitor 11b. The difference frequency short circuit 32a is different from the difference frequency short circuit 12 in that a supplemental capacitor 12c is provided in parallel to the capacitor 12b. The supplemental capacitors 11c and 12c have capacitors that become short-circuit at the operating frequency.

Temperatures of the capacitor 11b of the difference frequency short circuit 11 and the capacitor 12b of the difference frequency short circuit 12 of the power amplifier 100 rise by the capacitors being heated with microwave power flowing through the capacitors during operation.

Temperature rise may affect on the capacitors, for example, electrostatic capacitance becomes small, equivalent series resistance becomes large in a high frequency range or insulation resistance becomes low. Particularly, in a case of capacitors using dielectric porcelain having relative permittivity depending on a temperature, there is a possibility that electrostatic capacitance may drastically change.

In contrast, in the power amplifier 120, the difference frequency short circuits 31a and 32a further include supplemental capacitors 11c and 12c that become short-circuit at the operating frequency. A microwave current at the operating frequency flowing per one capacitor is reduced, so that it is possible to prevent increase of temperatures of the capacitors. It is therefore possible to prevent characteristics fluctuation of the power amplifier 120 due to change of electrostatic capacitance of the capacitors.

Second Embodiment

Figure 9:
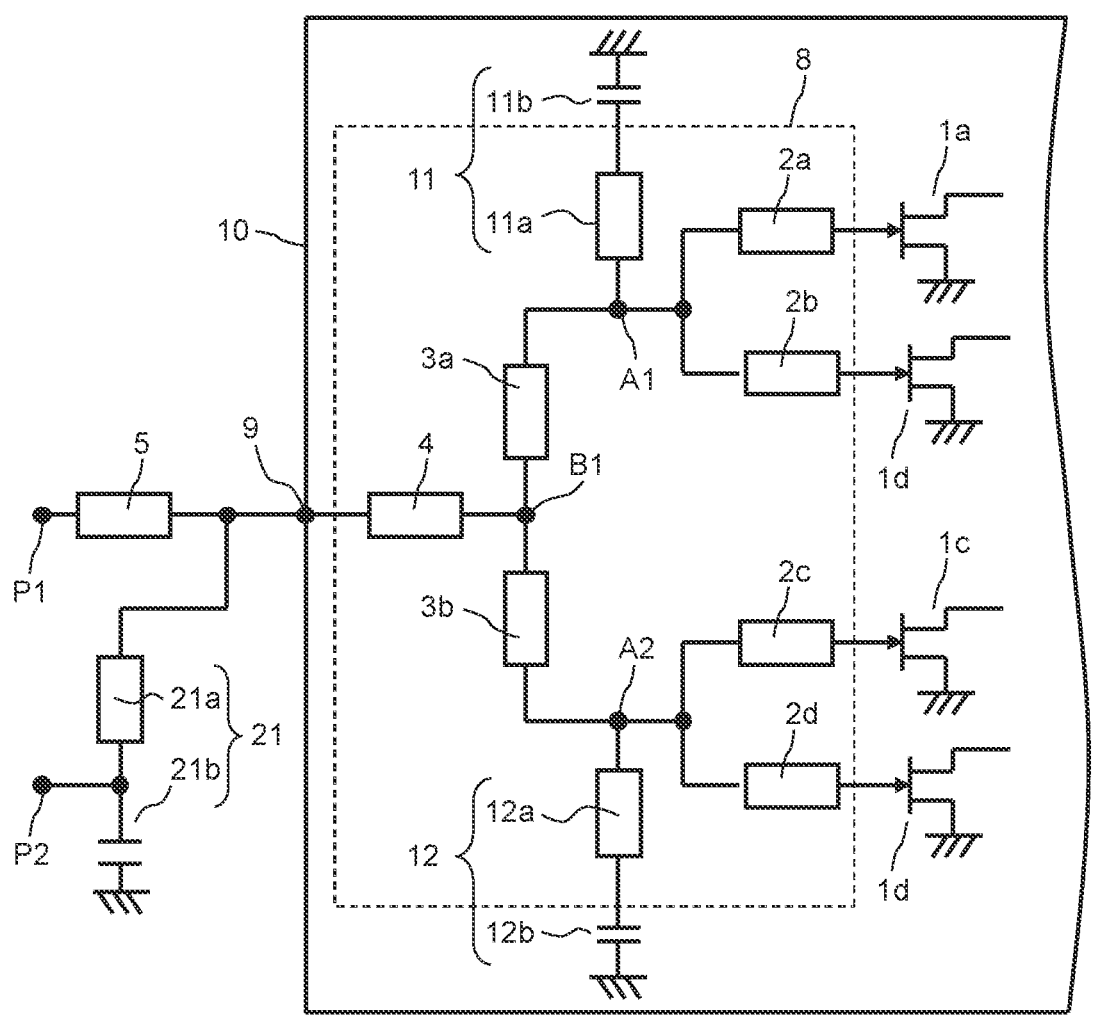
FIG. 9 is a circuit diagram of a power amplifier according to a second embodiment.

FIG. 9 is a circuit diagram of a power amplifier 130 according to a second embodiment. The power amplifier 130 is a power amplifier in which technical features described in the first embodiment are applied on the input side of the amplifiers 1a, 1b, 1c and 1d. The power amplifier of the second embodiment can be obtained by inverting the input/output of the amplifier 1 in the configuration described in the first embodiment.

A tournament circuit of the second embodiment is a tournament distribution circuit including series inductors 2a, 2b, 2c, 2d, 3a, 3b and 4 and distributing an input signal to a plurality of amplifiers. Note that the tournament synthesis circuit described in the first embodiment can be connected to the output side of the amplifiers 1a, 1b, 1c and 1d. The terminal P1 in the second embodiment functions as an input terminal. According to the configuration of the second embodiment, various technical features described in the first embodiment can be implemented with circuits on the input side of the amplifier 1.

According to the configuration of the second embodiment, by the difference frequency short circuits described in the first embodiment being provided on the input side of the transistor, it is possible to reduce impedance of the input circuit viewed from the amplifier 1 over a range from Δf1 to Δf3 as well as implement favorable impedance matching in a wide band. It is therefore possible to continuously reduce distortion components occurring in the offset frequency in a frequency band from Δf1 to Δf3. This results in making it possible to reduce circuit size and prevent degradation of distortion characteristics from a minimum offset frequency to a maximum offset frequency in a case where a desired offset frequency is expanded.

Figure 10:
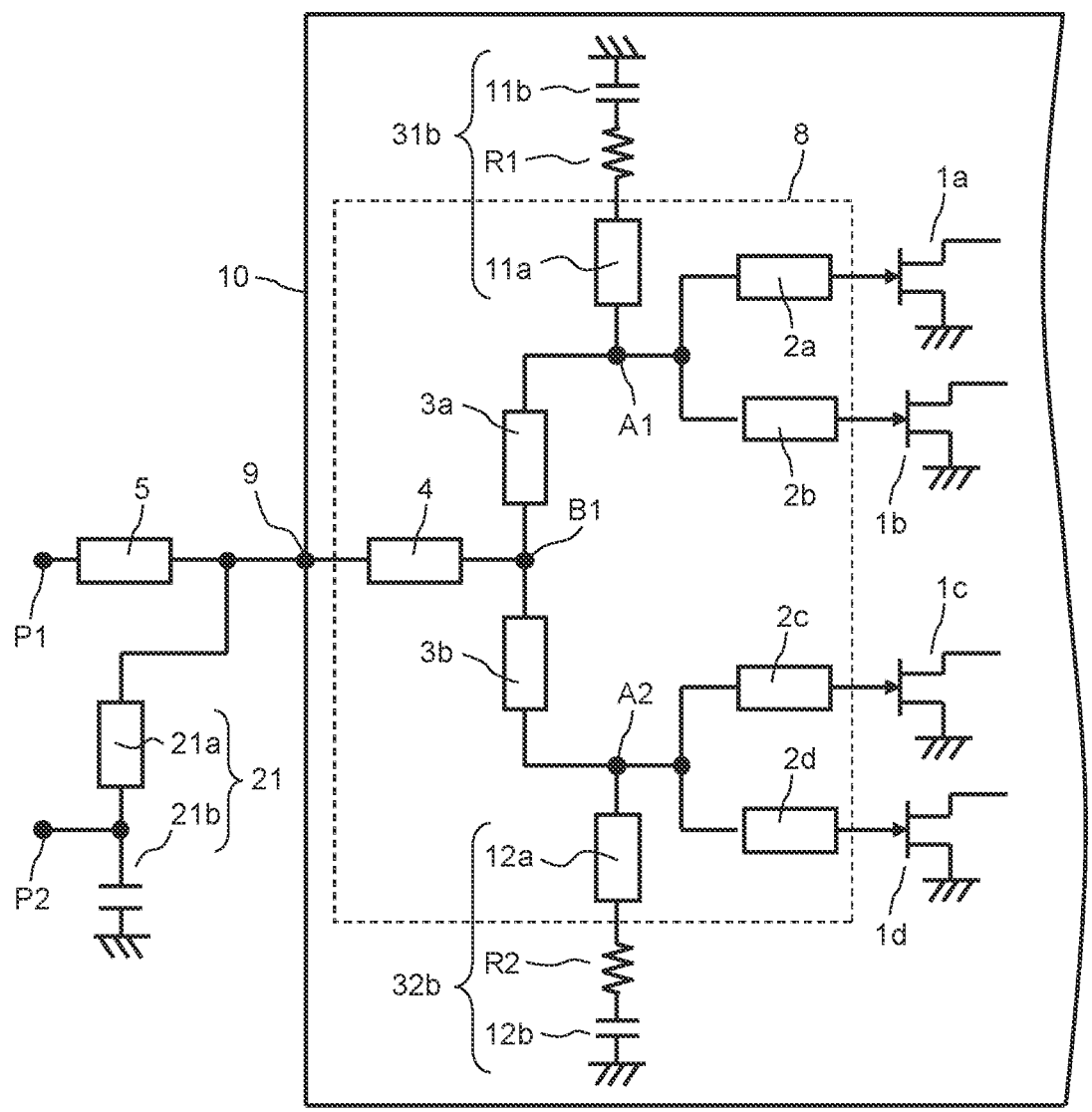
FIG. 10 is a circuit diagram of a power amplifier according to a modification of the second embodiment.

FIG. 10 is a circuit diagram of a power amplifier 140 according to a modification of the second embodiment.

The power amplifier 140 includes a difference frequency short circuit 31b in place of the difference frequency short circuit 11 and includes a difference frequency short circuit 32b in place of the difference frequency short circuit 12. The difference frequency short circuit 31b is different from the difference frequency short circuit 11 in that a resistor R1 connected in series to the parallel inductor 11a and the capacitor 11b is provided. The difference frequency short circuit 32b is different from the difference frequency short circuit 12 in that a resistor R2 connected in series to the parallel inductor 12a and the capacitor 12b is provided.

As a result of the power amplifier 140 including the resistors R1 and R2, an effect of preventing unnecessary oscillation is provided in addition to effects similar to the effects of the power amplifier 130.

Other points are the same as the power amplifier 130.

Note that the resistor R1 and the resistor R2 may have the same or different resistance values. While in FIG. 10, the resistor R1 is connected between the parallel inductor 11a and the capacitor 11b, the resistor R1 only requires to be connected in series to the parallel inductor 11a or the capacitor 11b and can be provided at a different position. Further, while in FIG. 10, the resistor R2 is connected between the parallel inductor 12a and the capacitor 12b, the resistor R2 only requires to be connected in series to the parallel inductor 12a or the capacitor 12b and can be provided at a different position.

The present disclosure is not limited to the above-described examples and can include various modifications. For example, the above-described examples are described in detail to describe the present disclosure in an easy-to-understand manner, and the present disclosure is not necessarily limited to one including all the described components.

Further, part of the components in a certain example can be replaced with a component of another example, or a component of a certain example can be added to a component of another example. Further, other components can be added to, deleted from or replaced with part of the components of each example.

REFERENCE SIGNS LIST 1,1a,1b,1c,1d amplifier; 2,2a,2b,2c,2d,3,3a,3b,4,5 series inductor; 8 substrate; 9 package terminal; 10 package; 11,12,21,31a,31b,32a,32b difference frequency short circuit; 11a,12a,13a,21a parallel inductor; 11b,12b, 13b,21b capacitor; 11c,12c supplemental capacitor; 13 supplemental difference frequency short circuit; 100, 110,120,130,140 power amplifier; A1,A2,B1 connection point; R1,R2 resistor

The invention claimed is:

1. A power amplifier comprising:
a plurality of amplifiers;
a tournament circuit including a plurality of transmission lines arranged in a tournament form and connected to the plurality of amplifiers; and
a plurality of difference frequency short circuits each including an inductor and a capacitor connected in series to each other,
wherein resonant frequencies of the plurality of difference frequency short circuits become smaller as the difference frequency short circuits are farther from the plurality of amplifiers, and
difference frequency short circuits connected to a plurality of nodes in a stage closest to the amplifiers of the tournament circuit among the plurality of difference frequency short circuits include inductive reactance that resonates with impedance seen from the nodes toward the amplifiers at an operating frequency and have different resonant frequencies.

2. The power amplifier according to claim 1, comprising a package on which the plurality of amplifiers are mounted,
wherein the difference frequency short circuit with a resonant frequency equal to or larger than a specific resonant frequency determined in advance is mounted on the package, and
the difference frequency short circuit with a resonant frequency smaller than the specific resonant frequency is provided outside the package.

3. The power amplifier according to claim 2, wherein the specific resonant frequency is 10 MHz.

4. The power amplifier according to claim 1, wherein the tournament circuit is a tournament synthesis circuit that synthesizes amplified signals of the plurality of amplifiers.

5. The power amplifier according to claim 1, wherein the tournament circuit is a tournament distribution circuit distributing an input signal to the plurality of amplifiers.

6. The power amplifier according to claim 3, comprising DC bias voltage supplying means supplying a predetermined DC bias voltage to lines connected to output terminals of the plurality of amplifiers.

7. The power amplifier according to claim 6, wherein the DC bias voltage supplying means includes a microstrip line having an electrical length of $\lambda/4$ in the operating frequency band and a capacitor grounding the microstrip line, and
a DC bias source is connected between the microstrip line and the capacitor grounding the microstrip line.

8. The power amplifier according to claim 5, wherein the difference frequency short circuit includes a resistor connected in series to the inductor and the capacitor.

9. The power amplifier according to claim 1, wherein the resonant frequencies of the plurality of difference frequency short circuits exist between a minimum value and a maximum value of difference frequencies at a high frequency end and a low frequency end of high-frequency signals amplified by the plurality of amplifiers.

* * * * *